US007989023B2

(12) United States Patent
Muggli et al.

(10) Patent No.: US 7,989,023 B2
(45) Date of Patent: Aug. 2, 2011

(54) METHOD OF IMPROVING MIXING OF AXIAL INJECTION IN THERMAL SPRAY GUNS

(75) Inventors: Felix Muggli, Winterthur (CH); Marc Heggemann, Winterthur (CH); Ronald J. Molz, Mount Kisco, NY (US)

(73) Assignee: Sulzer Metco (US), Inc., Westbury, NY (US)

(*) Notice: Subject to any disclaimer, the term of this patent is extended or adjusted under 35 U.S.C. 154(b) by 0 days.

(21) Appl. No.: 12/938,051

(22) Filed: Nov. 2, 2010

(65) Prior Publication Data

US 2011/0045197 A1 Feb. 24, 2011

Related U.S. Application Data

(62) Division of application No. 11/923,298, filed on Oct. 24, 2007, now Pat. No. 7,836,843.

(51) Int. Cl.
*C23C 16/00* (2006.01)

(52) U.S. Cl. ................ 427/255.23; 427/428.1; 239/265; 239/19; 239/464; 118/300

(58) Field of Classification Search .................. 239/265, 239/19, 464; 427/255.23, 428.1
See application file for complete search history.

(56) References Cited

U.S. PATENT DOCUMENTS

| | | | | |
|---|---|---|---|---|
| 4,980,267 | A * | 12/1990 | Taber | 430/382 |
| 4,982,067 | A | 1/1991 | Marantz et al. | |
| 5,302,414 | A | 4/1994 | Alkhimov et al. | |
| 6,082,635 | A * | 7/2000 | Seiner et al. | 239/265.19 |
| 6,663,013 | B1 | 12/2003 | Vanden Heuvel et al. | |
| 2004/0018317 | A1 | 1/2004 | Heinrich et al. | |
| 2007/0138147 | A1 | 6/2007 | Molz et al. | |

FOREIGN PATENT DOCUMENTS

| | | |
|---|---|---|
| EP | 1 369 498 | 12/2003 |
| FR | 2 869 311 | 10/2005 |

* cited by examiner

*Primary Examiner* — Parviz Hassanzadeh
*Assistant Examiner* — Albert Hilton
(74) *Attorney, Agent, or Firm* — Greenblum & Bernstein, P.L.C.

(57) ABSTRACT

Method for performing a thermal spray process. Method includes heating and/or accelerating a gas to form an effluent gas stream, feeding a particulate-bearing carrier stream through an axial injection port into the effluent gas stream to form a mixed stream, in which the axial injection port includes a plurality of chevrons located at a distal end of said axial injection port, and impacting the mixed stream on a substrate to form a coating.

20 Claims, 5 Drawing Sheets

METHOD OF IMPROVING MIXING OF AXIAL INJECTION IN THERMAL SPRAY GUNS

CROSS-REFERENCE TO RELATED APPLICATION

This application is a Divisional of U.S. patent application Ser. No. 11/923,298 filed Oct. 24, 2007, the disclosure of which is expressly is expressly incorporated by reference herein in its entirety.

STATEMENT REGARDING SPONSORED RESEARCH OR DEVELOPMENT

Not Applicable.

REFERENCE TO SEQUENCE LISTING

Not Applicable.

BACKGROUND OF THE INVENTION

1. Field of the Invention

This invention relates generally to improved thermal spray application devices, and particularly to a feedstock injector for injecting feedstock material axially into a downstream flow of heated gas.

2. Description of Related Art

Thermal spraying may generally be described as a coating method in which powder or other feedstock material is fed into a stream of energized gas that is heated, accelerated, or both. The feedstock material is entrapped by the stream of energized gas from which it receives thermal and/or kinetic energy. The energized feedstock is then impacted onto a surface where it adheres and solidifies, forming a relatively thick thermally sprayed coating by the repeated cladding of subsequent thin layers.

It has been previously recognized that, in the case of some thermal spray applications, injecting feedstock axially into an energized gas stream presents certain advantages over other feedstock injection methods. Typically, feedstock is fed into a stream in a direction generally described as radial injection, in other words in a direction more or less perpendicular to the direction of travel of the stream. Radial injection is commonly used as it provides an effective means of mixing particles into an effluent stream and thus transferring the energy to the particles in a short span. Such is the case with plasma where short spray distances and high thermal loading require rapid mixing and energy transfer for the process to apply coatings properly. Axial injection can provide advantages over radial injection due to the potential to better control the linearity and the direction of feedstock particle trajectory when axially injected. Other advantages include having the particulate in the central region of the effluent stream, where the energy density is likely to be the highest, thus affording the maximum potential for energy gain into the particulate. Lastly axial injection tends to disrupt the effluent stream less than radial injection techniques currently practiced.

Thus, in many thermal spray process guns, axial injection of feedstock particles is preferred to inject the particles, using a carrier gas, into the heated and/or accelerated gas simply referred to in this disclosure as effluent. The effluent can be plasma, electrically heated gas, combustion heated gas, cold spray gas, or combinations thereof. Energy is transferred from the effluent to the particles in the carrier gas stream. Due to the nature of stream flow and two phase flow, this mixing and subsequent transfer of energy is limited in axial flows and requires that the two streams, effluent and particulate bearing carrier, be given sufficient time and travel distance to allow the boundary layer between the two flows to break down and thus permit mixing to occur. During this travel distance, energy is lost to the surroundings through heat transfer and friction resulting in lost efficiency. Many thermal spray process guns that do utilize axial injection are then designed longer than would normally be required to allow for this mixing and subsequent energy transfer to occur.

These limitations to mix the particulate bearing carrier and effluent streams becomes even more pronounced when the particulate-bearing carrier fluid is a liquid, and, in many cases, they have prevented the use of liquid feeding into axial injection thermal spray process guns. For liquid injection techniques the use of gas atomization to produce fine droplet streams aids in getting the liquid to mix with the effluent stream more readily to enable liquid injection to work at all but this method still requires some considerable distance to allow the gas and fine droplet stream and effluent stream to mix and transfer energy. This method also produces a certain amount of turbulence in the stream flows.

Attempts at promoting mixing such as introduction of discontinuities and impingement of the flows also produces turbulence. Radial injection, commonly used with thermal spray processes such as plasma to ensure mixing in a short distance also produces turbulence as the two streams intersect at right angles. In fact, most acceptable methods of injection that promote rapid mixing currently use methods that deliberately introduce turbulence as the means to promote the mixing. The turbulence serves to break down the boundary layer between the flows and once this is accomplished mixing can occur.

The additional turbulence often results in unpredictable energy transfer between the effluent and particulate bearing carrier stream as the flow field is constantly in flux, producing variations within the flow field that affect the transfer of energy. Turbulence represents a chaotic process and causes the formation of eddies of different length scales. Most of the kinetic energy of the turbulent motions is contained in the large scale structures. The energy "cascades" from the large scale structures to smaller scale structures by an inertial and essentially in viscid mechanism. This process continues creating smaller and smaller structures which produces a hierarchy of eddies. Eventually this process creates structures that are small enough that molecular diffusion becomes important and viscous dissipation of energy finally takes place. The scale at which this happens is the Kolmogorov length scale. Thus the turbulence results in conversion of some of the kinetic energy to thermal energy. The result is a process that produces more thermal energy rather than kinetic for transfer to the particles, limiting the performance of such devices. Complicate the process by having more than one turbulent stream and the results are unpredictable as stated.

Turbulence also increases energy loss to the surroundings as the turbulence results in loss of at least some of the boundary layer in the effluent flow field and thus promotes the transfer of energy to the surroundings as well as frictional affects within the flow when flows are contained within walls. For flow in a tube the pressure drop for a laminar flow is proportional to the velocity of the flow while for turbulent flow the pressure drop is proportional to the square of the velocity. This gives a good indication of the scale of the energy loss to the surroundings and internal friction.

Thus there remains a need in the art for an improved method and apparatus to promote rapid mixing of axially injected matter into thermal spray process guns and also limits the generation of turbulence in the flow streams as a result.

SUMMARY OF THE INVENTION

The invention as described provides an improved apparatus and method for promoting mixing of axially fed particles in a carrier stream with a heated and/or accelerated effluent stream without introducing significant turbulence into either the effluent or carrier streams. Embodiments of the invention utilize a thermal spray apparatus having an axial injection port with a chevron nozzle. For purposes of this application, the term "chevron nozzle" may include any circumferentially non-uniform type of nozzle.

One embodiment of the invention provides a method for performing a thermal spray process (where, for purposes of the invention, the term "thermal spray process" may also include cold spray processes). The method includes the steps of heating and/or accelerating an effluent gas to form a high velocity effluent gas stream, feeding a particulate-bearing stream through an axial injection port into the effluent gas stream to form a mixed stream, such that the axial injection port has a plurality of chevrons located at a distal end of the axial injection port, and impacting the mixed stream on a substrate to form a coating.

In another embodiment, the invention provides a thermal spray apparatus that includes a device for heating and/or accelerating an effluent gas stream, and an injection port configured to axially feed a particulate-bearing stream into the effluent gas stream, in which the axial injection port has a plurality of chevrons located at a distal end of said axial injection port, and a nozzle in fluid connection with the heating and/or accelerating device and the injection port.

In yet another embodiment of the invention, a thermal spray apparatus is provided. The apparatus includes an effluent gas acceleration component configured to produce an effluent gas stream, an axial injection port with a plurality of chevrons, in which the axial injection port is configured to axially feed a fluid stream into the effluent gas stream, and a nozzle in fluid connection with the effluent gas acceleration component and the injection port.

In yet another embodiment, an axial injection port for a thermal spray gun is provided. The injection port includes a cylindrical tube having an inlet and an outlet, in which the inlet is configured to receive fluid flow through the cylindrical tube and the outlet includes a plurality of chevrons located radially about the circumference of the outlet.

Still other embodiments of the present invention are directed to a thermal spray apparatus that includes a device configured for at least one of heating or accelerating an effluent gas stream, and an injection port configured to axially feed a particulate-bearing stream into said effluent gas stream. The axial injection port includes a plurality of chevrons located at a distal end of said axial injection port, and the device surrounds and is coaxial with the injection port. Further, a nozzle, co-axial the injection port, surrounds and is in fluid connection with the device and the injection port.

Embodiments are directed to a method for performing a thermal spray process. The method includes at least one of heating and accelerating a gas to form an effluent gas stream, feeding a particulate-bearing carrier stream through an axial injection port having a plurality of chevrons located at a distal end and into the effluent gas stream to form a mixed stream, and forming a coating by impacting a substrate with the mixed stream.

According to embodiments, the plurality of chevrons can be inclined outward to a larger diameter than the distal end of the injection port.

In accordance with other embodiments, the plurality of chevrons may be inclined inward to a smaller diameter than the distal end of the injection port.

Embodiments of the instant invention are directed to a method for performing a thermal spray process. The method includes at least one of heating and accelerating a gas to form an effluent gas stream, feeding a particulate-bearing carrier stream through an axial injection port to be mixed with the effluent gas stream to form a mixed stream, enhancing mixing of the particulate-bearing carrier stream with the effluent gas stream through structures arranged at a distal end of the axial injection port, and forming a coating by directing the mixed stream onto a substrate.

According to aspects of the embodiments, the structures arranged at the distal end of the axial injection port can form a circumferentially non-uniform type of nozzle.

In accordance with still yet other embodiments of the present invention, the structures arranged at the distal end of the axial injection port may include a plurality of chevrons at least one of angled inwardly or outwardly with respect to a longitudinal axis of the axial injection port.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF FIGURES

The accompanying drawings, which are included to provide further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

Figure 1:
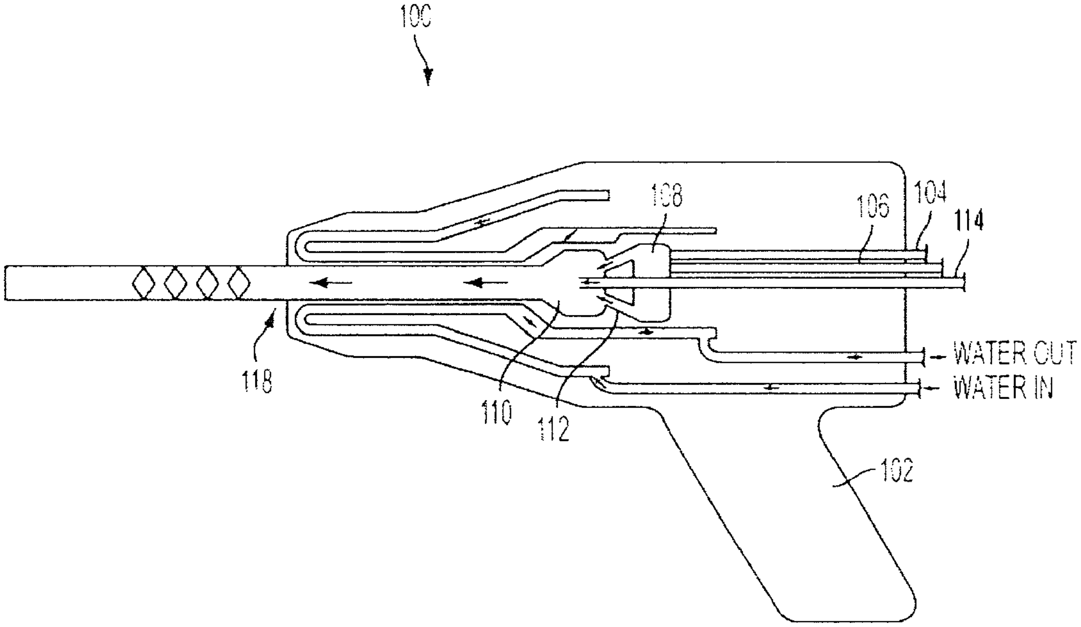
FIG. 1 provides a schematic of a thermal spray gun suitable for use in an embodiment of the invention.

FIG. 1 provides a schematic of a typical thermal spray gun 100 that may be used in accordance with the present invention. The gun includes a housing 102 that includes a fuel gas feed line 104 and an oxygen (or other gas) feed line 106. The fuel gas feed line 104 and an oxygen feed line 106 empty in to a mixing chamber 108 where fuel and oxygen are combined and fed into a combustion chamber 110 through a plurality of ports 112 that are typically located radially around a feedstock and carrier fluid axial injection port 114. The gun housing 102 also includes a feed line for feedstock and carrier fluid 116. The feedstock and carrier fluid feed line empties into the combustion chamber 110, with the axial injection port 114 generally aligned axially with the exit nozzle 118 of the thermal spray gun 100.

In operation, the oxygen/fuel mixture enters the combustion chamber through the ports 112, and feedstock and carrier fluid exit the axial injection port 114 simultaneously. The oxygen/fuel mixture is ignited in the combustion chamber and accelerates feedstock toward the exit nozzle 118. Proper mixing of the two flow streams—the ignited gas effluent from the radial ports 112 shown as $F_1$ and the carrier gas/feedstock stream from axial injection port 114 shown as $F_2$—impacts efficiency of the thermal spray process. The mixing of the feedstock and heated gas stream and subsequent transfer of energy may be optimized by use of a notched chevron nozzle on the axial injection port 114.

In the embodiment of FIG. 1, the fuel gas feed line 104, the oxygen feed line 106, the mixing chamber 108, the combustion chamber 110, and the plurality of ports 112 may generally be referred to as components or elements necessary to accelerate an effluent gas stream. Other thermal spray processes may use different effluent acceleration components and gasses that are equally applicable to the present invention. Embodiments of the present invention are applicable to a wide variety of thermal spray processes using or potentially can use axial injection. Examples of processes that may be used with embodiments of the present invention include, but are not limited to, cold spraying, flame spraying, high velocity oxy fuel (HVOF) spraying, high velocity liquid fuel (HVLF) spraying, high velocity air fuel (HVAF) spraying, arc spraying, plasma spraying, detonation gun spraying, and spraying utilizing hybrid processes that combine one or more thermal spray processes. Carrier fluids are typically the carrier gasses used in thermal spray guns, including but not limited to argon and nitrogen, that contain the typical thermal spray particulate of various size ranges from about 1 μm to larger than 100 μm according to each process. One benefit of the invention that may result from the improved mixing is the ability to process higher mass flow rates of particulate as the mixing promotes better energy transfer with less wasted energy. Liquid based carrier fluids containing particulates, or dissolved feed stock in solution, or as a precursor, will also benefit from enhanced mixing, especially in the form of a gas atomized stream generated just prior to the axial injection port exit.

Figure 2:
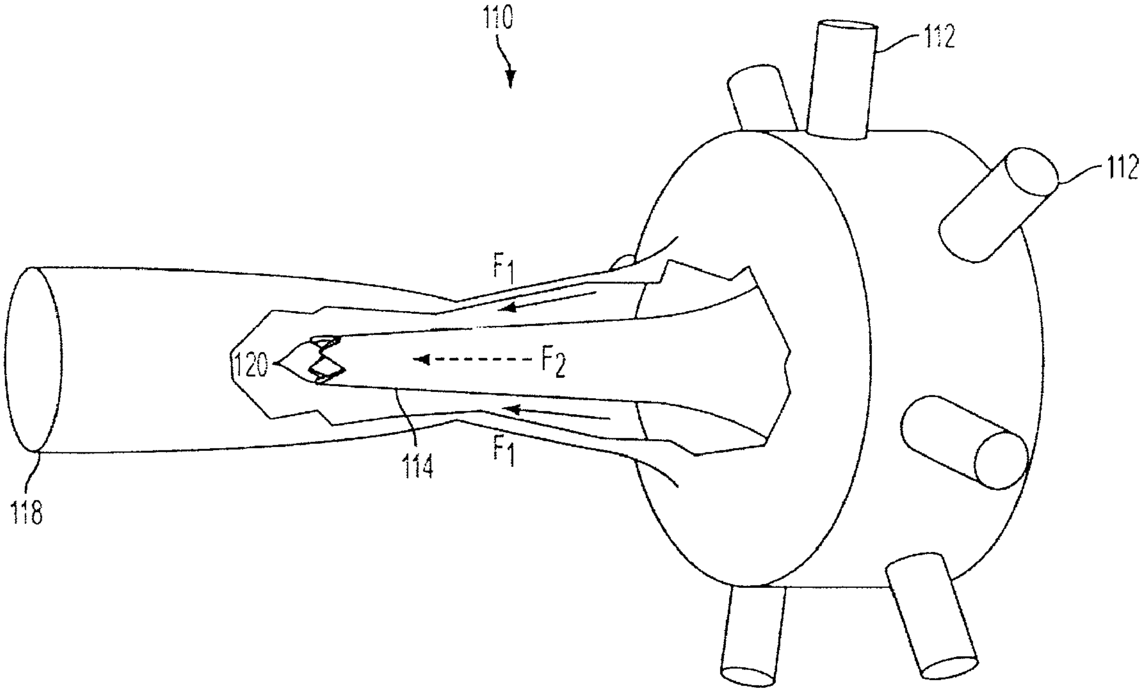
FIG. 2 provides a cut-away schematic of the combustion chamber and exit nozzle regions of a thermal spray gun in accordance with an embodiment of the invention.

FIG. 2 provides a schematic view of the convergent chamber 110 and divergent exit nozzle 118 regions of a cold spray gun. Axial injection port 114 is shown with a plurality of chevrons 120 at the distal end of the port defining an outlet. Each of the chevrons is generally triangular in configuration. The chevrons 120 are located radially—and in some embodiments equally spaced—around the circumference of the distal end of the axial injection port 114. Introducing the chevrons 120 to the axial injection port 114 increases mixing between the two flow streams $F_1$ and $F_2$ as they meet. The energy of the effluent stream passing through the chamber 110 and accelerated in the nozzle 118 more readily transfers the thermal and kinetic characteristics of the effluent flow to the carrier flow and particulate with the use of these chevrons.

Figure 3:
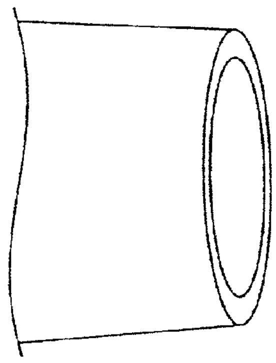
FIG. 3 PRIOR ART
FIG. 3 provides a schematic of the distal end of a conventional axial injection port.
Figure 4:
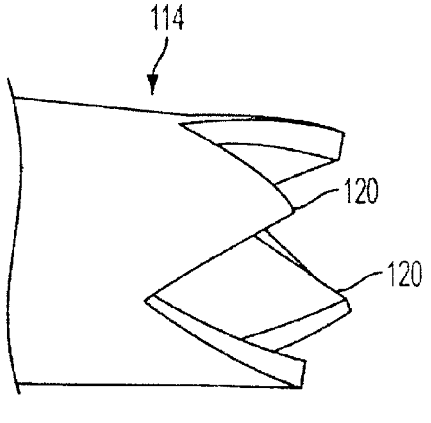
FIG. 4 provides a detailed schematic of the distal end of an axial injection port that includes chevrons according to an embodiment of the invention.

FIG. 3 provides a schematic of the distal end of a conventional axial injection port. In contrast, FIG. 4 provides a schematic of the distal end of axial injection port 114 including four chevrons 120 according to an embodiment of the present invention. In some embodiments, each chevron 120 includes a generally triangular shaped extension of the axial injection port 114. In the embodiment of FIG. 4, each chevron 120 is generally parallel to the wall of the axial injection port 114 to which the chevron is joined. Another embodiment, shown in FIG. 5, incorporates chevrons 130 that are flared, curved bent, or otherwise directed radially outward relative to the plane defining the distal end of the axial injection port 114. In another embodiment, the chevrons may be flared, curved, bent, or otherwise directed radially inward relative to the plane defining the distal end of the axial injection port. Angles of inclination for the chevrons up to 90 degrees inward or outward will provide enhanced mixing, while preferred inclination angles may be between 0 and about 20 degrees. Inclination angles higher than about 20 degrees, although providing enhanced mixing, may also tend to produce undesirable eddy currents and the possibility of turbulence depending upon the relative flow velocities and densities.

Figure 5:
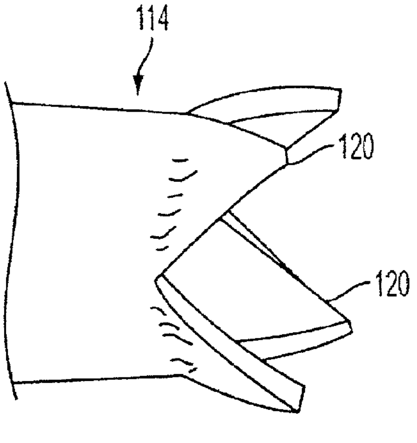
FIG. 5 provides a detailed schematic of the distal end of an axial injection port that includes chevrons according to another embodiment of the invention.

While FIG. 5 shows the chevrons 130 equally flared, other contemplated embodiments may have non-symmetrical flared chevrons that can correspond with non-symmetrical gun geometries, compensate for swirling affects often present in thermal spray guns, or other desired asymmetrical needs. In other embodiments different shape and/or arrangement may be used in place of a chevron shapes shown in FIGS. 4 and 5. For purposes of the present application, the term "chevron nozzle" may include any circumferentially non-uniform type of nozzle. Non-limiting examples of alternative chevron shapes include radially spaced rectangles, curved-tipped chevrons, semi-circular shapes, and the like. For purposes of the present application such alternate shapes are included under the general term chevrons. In another embodiment the wall thickness of each chevron may be tapered toward the chevron point.

Almost any number of chevrons can be used to aid in mixing. Four chevrons 120, 130 are shown in the embodiment of FIGS. 4 and 5, respectively. In some embodiments, 4 to as many as 6 chevrons may be ideal for most applications. However, other embodiments may use more or fewer chevrons without departing from the scope of the present invention. For the thermal spray gun depicted in FIG. 2 the number of chevrons on distal end of axial injection port 114 may coincide with the number of radial injection ports 112 to allow for symmetry in the flow pattern to produce uniform and predictable mixing in the combustion chamber 110.

In some embodiments, the chevrons shown in the various figures are generally a uniform extension of the axial injection port. In other embodiments, chevrons may be retrofit onto existing conventional axial injection ports by, for example, mechanical attachment. Retrofit applications may include use of clamps, bands, welds, rivets, screws or other mechanical attachments known in the art. While the chevrons would typically be made from the same material as the axial injection port, it is not required that the materials be the same. The chevrons may be made from a variety of materials known in the art that are suitable for the flows, temperatures and pressures of the axial feed port environment.

Figure 6:
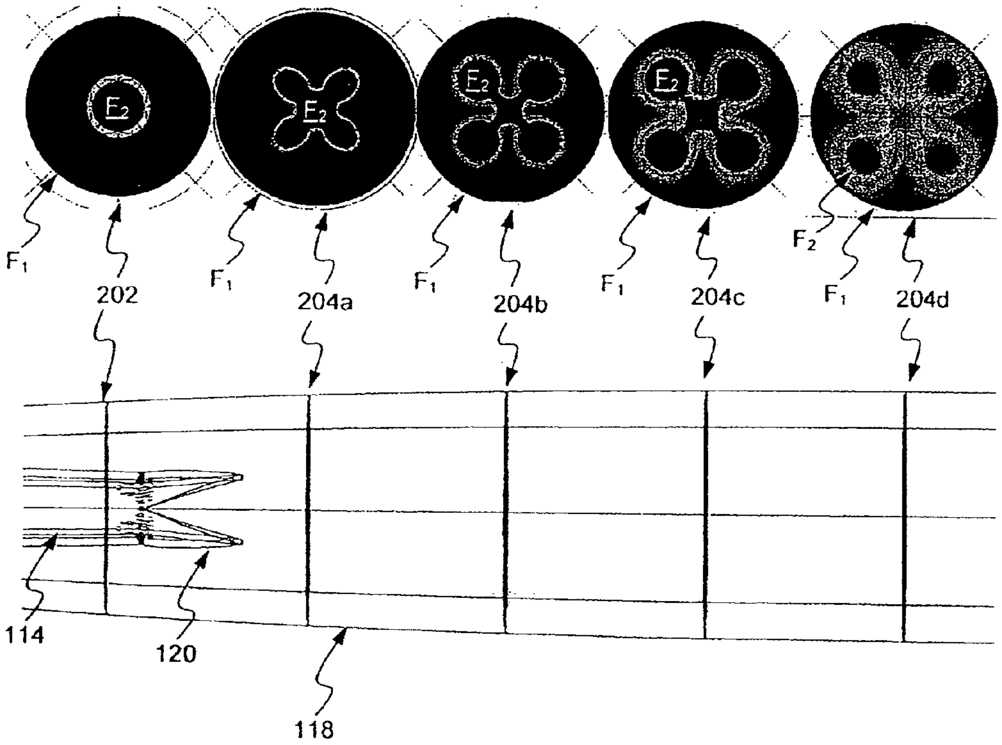
FIG. 6 provides boundary area change between two flows over a traveled distance emitted from a nozzle according to an embodiment of the invention.

FIG. 6 provides a schematic of various computer-modeled cross-sections of a modeled flow spray path for a thermal spray gun in an embodiment of the present invention. The bottom of the figure shows a side view of the nozzle 118 and axial injection port 114, and above are shown cross-sections 204*a*, 204*b*, 204*c*, 204*d* of the effluent and carrier flow paths at various points. Referring to FIG. 6, as the particulate bearing carrier flow $F_2$ and heated and/or accelerated effluent $F_1$ reach the chevrons 120, the physical differences, such as pressure, density, etc. between the flows causes the boundary between the flows to change from the initial interface shape, shown in cross-section 202—which is typically cylindrical, as dictated by the shape of the axial injection port 114—to a flower-like or asterisk-like shape shown in the cross-section 204*a*, increasing the shared boundary area between flows $F_1$ and $F_2$. The pressure differential that exists between the flows $F_1$ and $F_2$ will cause the higher pressure flow—either the effluent $F_1$ or carrier $F_2$—to accelerate radially in response to the pressure differential (potential flow) as the flows $F_1$ and $F_2$ progress down the length of the chevrons 120 to equalize the pressure. This radial acceleration will also be distorted to drive the flow around the chevron to equalize the pressure under the chevron as well. As shown in the subsequent shape cross-sections 204*b*, 204*c*, and 204*d* this asterisk-like shape continues to propagate as the flows $F_1$ and $F_2$ travel together, further increasing the shared boundary area between flows $F_1$ and $F_2$. Since the mixing of the streams is a function of the boundary area, the increase in boundary area increases the mixing rate as exemplified in FIG. 6. The use of inward or outwardly inclined chevrons increases the mixing affect by increasing the pressure differential between the flows thus causing a more rapid formation and extent to the shaping of the boundary area. The inclination can be either inwardly or outwardly directed depending upon the relative properties of the two streams and the desired affects.

Figure 7:
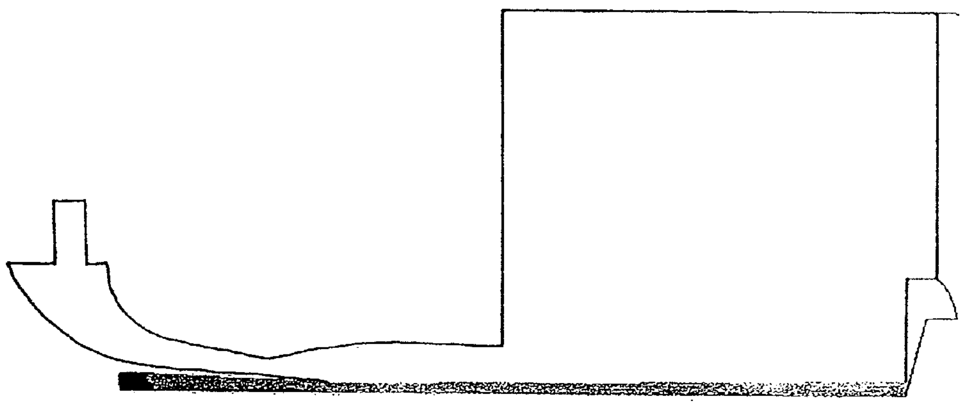
FIG. 7 provides a schematic of an axial injection velocity particle stream without use of chevrons.
Figure 8:
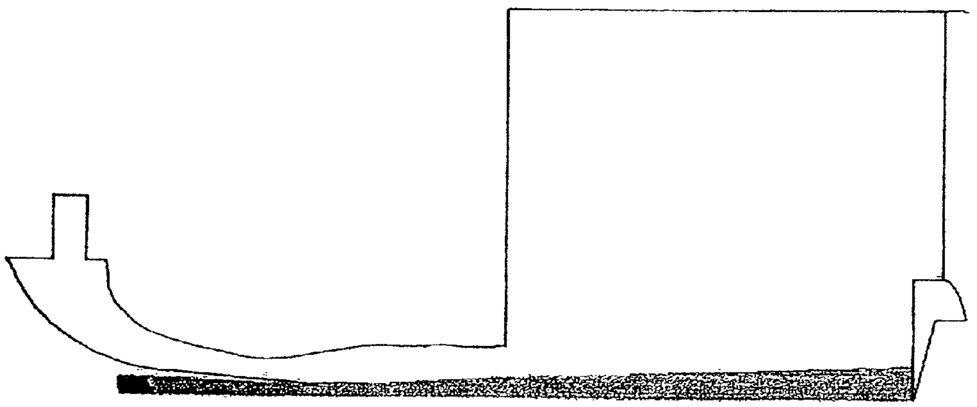
FIG. 8 provides a schematic of an axial injection velocity particle stream with use of non-inclined chevrons according to an embodiment of the present invention.
Figure 9:
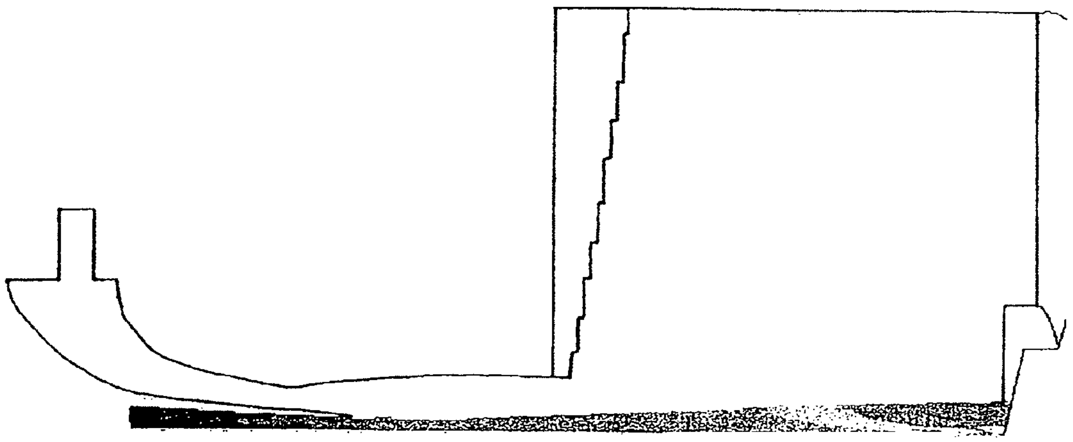
FIG. 9 provide a schematic of an axial injection velocity particle stream with use of 20 degree outward inclined chevrons according to an embodiment of the present invention.

Spray paths exiting nozzle shapes depicted in FIGS. 3, 4, and 5 were modeled in the cold spray gun similar to that depicted in FIG. 2. FIG. 7 provides the results of a computational fluid dynamic (CFD) model run of an axially injected particle velocity stream for a cold spray process as modeled in FIG. 2 without the use of chevrons as depicted in FIG. 3. FIG. 8 provides the results of a CFD model run of an axially injected particle velocity stream for a cold spray process as modeled in FIG. 2 with use of chevrons as depicted in FIG. 4 according to an embodiment of the present invention. Applying CFD modeling to an axial injection cold spray gun has shown measurable improvement in mixing of the particulate bearing carrier stream $F_2$ and heated and/or accelerated effluent stream $F_1$ and in the transfer of energy from the effluent gas directly to the feedstock particles. In FIG. 7, the resulting particle velocities and spray width is smaller than the particle velocities and spray width shown in FIG. 8 as a result of the improved mixing afforded by the addition of the chevrons. Furthermore, FIG. 9 provides the results of a CFD model run of an axially injected particle velocity stream for a cold spray process as modeled in FIG. 2 with use of outwardly inclined chevrons as depicted in FIG. 5 according to an embodiment of the present invention. As shown in FIG. 9, the particle velocities have increased even higher than with straight chevrons (FIG. 8), indicting an even better transfer of energy from the effluent gas to the particles occurred when using the outwardly inclined chevrons. Thus, the introduction of the chevrons, and even more so the inclined chevrons, has increased the overall velocity of the particles and expanded the particle field well into the effluent stream.

The inclusion of chevrons on axial injection ports can benefit any thermal spray process using axial injection. Thus, embodiments of the present invention are well-suited for axially-fed liquid particulate-bearing streams, as well as gas particulate-bearing streams. In another embodiment, two particulate-bearing streams may be mixed. In still another embodiment two or more gas streams may be mixed by sequentially staging axial injection ports along with an additional stage to mix in a particulate bearing carrier stream. In yet another embodiment, the chevrons can be applied to a port entering an effluent flow at an oblique angle by incorporating one or more chevrons at the leading edge of the port as is enters the effluent stream chamber.

In another embodiment, stream mixing in accordance with the present invention may be conducted in ambient air, in a low-pressure environment, in a vacuum, or in a controlled atmospheric environment. Also, stream mixing in accordance with the present invention may be conducted in any temperature suitable for conventional thermal spray processes.

Anyone skilled in the art can envision further enhancements to the apparatus as well as the use of shapes other than triangular for the chevrons. This apparatus will work on any thermal spray gun using axial injection to introduce particulate bearing carrier gas as well as liquids, additional effluent streams, and reactive gases.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed:

1. A method for performing a thermal spray process, comprising: heating and/or accelerating a gas to form an effluent gas stream; feeding a particulate-bearing carrier stream through an axial injection port into said effluent gas stream to form a mixed stream, wherein said axial injection port comprises a plurality of chevrons located at a distal end; and spraying the mixed stream through a nozzle that coaxially surrounds and is in fluid connection with the axial injection port, and impacting the mixed stream on a substrate to form a coating.

2. The method of claim 1, wherein said plurality of chevrons promotes mixing of the effluent gas stream and said particulate-bearing stream.

3. The method of claim 1, wherein said method is performed in a vacuum.

4. The method of claim 1, wherein said method is performed in ambient conditions.

5. The method of claim 1, wherein said method is performed in a controlled atmospheric condition.

6. The method of claim 1, wherein the particulate-bearing carrier stream is a gas.

7. The method of claim 1, wherein the particulate-bearing carrier stream is a liquid.

8. The method of claim 1, wherein the particulate-bearing carrier stream is a gas atomized liquid.

9. The method of claim 1, wherein the plurality of chevrons are inclined outward to a larger diameter than the distal end of the injection port.

10. The method of claim 9, wherein the plurality of chevrons are inclined outward from between 0 and about 20 degrees.

11. The method of claim 1, wherein said plurality of chevrons are inclined inward to a smaller diameter than the distal end of the injection port.

12. The method of claim 11, wherein the plurality of chevrons are inclined inward from between 0 and about 20 degrees.

13. The method of claim 1, wherein the plurality of chevrons are different sizes.

14. The method of claim 1, wherein the chevrons are positioned radially about a circumference of the distal end.

15. A method for performing a thermal spray process, comprising: at least one of heating and accelerating a gas to form an effluent gas stream; feeding a particulate-bearing carrier stream through an axial injection port having a plurality of chevrons located at a distal end and into the effluent gas stream to form a mixed stream; and spraying the mixed stream through a nozzle that coaxially surrounds and is in fluid connection with the axial injection port, and forming a coating by impacting a substrate with the mixed stream.

16. The method of claim 15, wherein the plurality of chevrons are inclined outward to a larger diameter than the distal end of the injection port.

17. The method of claim 15, wherein the plurality of chevrons are inclined inward to a smaller diameter than the distal end of the injection port.

18. A method for performing a thermal spray process, comprising: at least one of heating and accelerating a gas to form an effluent gas stream; feeding a particulate-bearing carrier stream through an axial injection port to be mixed with the effluent gas stream to form a mixed stream; enhancing mixing of the particulate-bearing carrier stream with the effluent gas stream through structures arranged at a distal end of the axial injection port; and spraying the mixed stream through a nozzle that coaxially surrounds and is in fluid connection with the axial injection port, and forming a coating by directing the mixed stream onto a substrate.

19. The method of claim 18, wherein the structures arranged at the distal end of the axial injection port form a circumferentially non-uniform type of nozzle.

20. The method of claim 19, wherein the structured arranged at the distal end of the axial injection port include a plurality of chevrons at least one of angled inwardly or outwardly with respect to a longitudinal axis of the axial injection port.

* * * * *